United States Patent [19]

Kueck et al.

[11] Patent Number: 5,661,386
[45] Date of Patent: Aug. 26, 1997

[54] METHOD FOR ASSESSING IN-SERVICE MOTOR EFFICIENCY AND IN-SERVICE MOTOR/LOAD EFFICIENCY

[75] Inventors: John D. Kueck; Pedro J. Otaduy, both of Oak Ridge, Tenn.

[73] Assignee: Lockheed Martin Energy Systems, Inc., Oak Ridge, Tenn.

[21] Appl. No.: 600,654

[22] Filed: Feb. 13, 1996

Related U.S. Application Data

[63] Continuation of Ser. No. 155,259, Nov. 22, 1993, abandoned.

[51] Int. Cl.$^6$ ..................................................... G01R 31/34
[52] U.S. Cl. ........................... 318/490; 318/455; 318/558; 318/798; 324/177; 73/862.193
[58] Field of Search ..................................... 318/650, 798, 318/799, 805, 806, 812, 438, 453, 454, 455, 490, 558; 73/862, 862.23, 862.28, 862.193, 116; 324/512, 522, 772, 160, 177; 364/480, 481, 482, 483, 550, 551.01, 142

[56] References Cited

U.S. PATENT DOCUMENTS

| | | |
|---|---|---|
| 3,434,055 | 3/1969 | Frick . |
| 3,989,991 | 11/1976 | Brennen et al. . |
| 4,123,009 | 10/1978 | Kilpinen . |
| 4,141,244 | 2/1979 | Dumbeck . |
| 4,207,510 | 6/1980 | Woodbury . |
| 4,300,078 | 11/1981 | Pascal . |
| 4,337,427 | 6/1982 | Maudal ................................... 318/615 |
| 4,370,098 | 1/1983 | McClain et al. . |
| 4,423,367 | 12/1983 | Blaschke et al. . |
| 4,442,393 | 4/1984 | Abbondanti . |
| 4,616,179 | 10/1986 | Braun . |
| 4,672,288 | 6/1987 | Abbondanti . |
| 4,777,422 | 10/1988 | Slicker et al. . |
| 4,888,996 | 12/1989 | Rak et al. . |
| 4,965,513 | 10/1990 | Haynes et al. . |
| 5,153,489 | 10/1992 | Unsworth et al. . |
| 5,153,506 | 10/1992 | Trenkler et al. . |
| 5,155,797 | 10/1992 | Nomura et al. . |
| 5,309,089 | 5/1994 | Kawamura . |
| 5,388,052 | 2/1995 | Mann . |

FOREIGN PATENT DOCUMENTS 2 044 940 A   10/1980   United Kingdom .

OTHER PUBLICATIONS

Vincent Del Toro, Entitled: *Electromechanical Devices for Energy Conversion and Control Systems,* pub. Prentice-Hall, Inc. Chapter 4, pp. 170–178.

Application Data, MG Jan. 1987, Part 14, pp. 6–7, Entitled: *Effects of Unbalanced Voltages on the Performance of Polyphase Induction Motors,* MG1–14.35.

*Primary Examiner*—Bentsu Ro
*Attorney, Agent, or Firm*—Edward A. Pennington; James M. Spicer

[57] ABSTRACT

A method and apparatus for assessing the efficiency of an in-service motor. The operating characteristics of the in-service motor are remotely measured. The operating characteristics are then applied to an equivalent circuit for electrical motors. Finally the equivalent circuit is evaluated to determine the performance characteristics of said in-service motor. Based upon the evaluation an individual is able to determine the rotor speed, power output, efficiency, and toque of the in-service motor. Additionally, an individual is able to confirm the calculations by comparing measured values with values obtained as a result of the motor equivalent circuit evaluation.

18 Claims, 5 Drawing Sheets

METHOD FOR ASSESSING IN-SERVICE MOTOR EFFICIENCY AND IN-SERVICE MOTOR/LOAD EFFICIENCY

This is a continuation of application Ser. No. 08/155,259, filed Nov. 22, 1993, abandoned.

FIELD OF THE INVENTION

This invention relates to the assessment of electrical-motors and electrical-motor-driven devices. More particularly, the invention relates to the use of a motor equivalent circuit as a model from which to calculate motor efficiency.

BACKGROUND OF THE INVENTION

Electrical-motor-driven devices are widely utilized. However, it is difficult to monitor the operating condition of such motors and devices without removing the motor from service. When such motor-driven-devices are in service, it is possible to measure voltage imbalance, high harmonic content of currents and voltages, motor and ambient temperatures, etc., which affect motor efficiency.

In fact, the ability to detect degradations of electrical-motor-driven systems without removing the motor from service is especially important where motors are used in safety and/or cost sensitive situations, for example, in nuclear generating stations and computer chip manufacturing plants. Additionally, the ability to calculate on-line motor torque output and motor efficiency, with a confirmation that the calculations are correct, is very important in many situations where electrical-motor-driven devices are utilized. These abilities can be very useful in reducing energy consumption and motor replacement costs in installations where large numbers of motors are used.

Attempts have been made to provide methods and apparatuses for monitoring the condition of electrical motors. For example, U.S. Pat. No. 4,442,393 to Abbondanti describes an apparatus and method for monitoring the operation of an induction motor. Based upon the sensed input voltages and the currents fed into a standard induction motor, the motor overall reactance, the motor overall real impedance, the air gap resistance, the parallel combination of stator and rotor leakage reactances, and the stator leakage reactance are derived. These operating characteristics are then utilized to control torque produced by the motor.

Additionally, U.S. Pat. No. 4,888,996 to Rak et al. describes a method and apparatus which utilizes motor armature current, voltage drop across the armature, and the electrical resistance of the armature for generating mechanical values of motor output mechanical power, armature speed, and a motor torque factor representative of the motor torque multiplied by a constant. The method and apparatus described by Rak et al. were developed to address the problems associated with the assessment of D.C. motors.

Nothing in the prior art, however, discloses a remote on-line process monitoring and diagnostic system such as that embodied by the subject invention. Specifically, nothing in the prior art discloses the subject method or apparatus for the remote assessment of a motor's rotor speed, power output, efficiency and torque.

SUMMARY OF THE INVENTION

An object of the invention is to provide a method and apparatus for detecting degradation in an electrical motor-driven system without removing the motor from service.

Another object of the invention is the provision of a method and apparatus for remotely calculating motor efficiency, with a confirmation that the calculations are correct.

A further object of the invention is to provide a method and apparatus capable of remotely calculating torque output, with a confirmation that the calculations are correct.

An object of the invention is also the provision of a method and apparatus for remotely calculating the rotor speed and power output of an operating motor.

These and other object of the subject invention are achieved by the claimed method and apparatus for assessing the efficiency of an in-service motor. The method is achieved by initially determining equivalent circuit parameters of the motor. The operating characteristics, i.e., voltage and current, of the in-service motor are then remotely measured. The equivalent circuit parameters and operating characteristics are then applied to an equivalent circuit representative of operating induction motors. Finally the equivalent circuit is evaluated to determine performance characteristics of the in-service motor.

As a result of the equivalent circuit evaluation, an individual is able to determine the rotor speed, power output, efficiency, and toque of the in-service motor. Additionally, an individual is able to confirm the calculations by comparing measured values with values obtained as a result of the motor equivalent circuit evaluation.

Other object, advantages and salient features of the invention will become apparent from the following detailed description, which taken in conjunction with the annexed drawings, discloses preferred embodiments of the invention.

DETAILED DESCRIPTION OF THE PREFERRED EMBODIMENT

When electrical motors are placed in service, for example, safety related motors in nuclear generating stations, the ability to (1) detect degradation without removing the motor from service and (2) calculate torque output and efficiency with a confirmation that the calculations are correct is very important. The ability to calculate efficiency, confirm the accuracy of the calculation, and detect power source degradation is very helpful in reducing energy consumption and motor replacement costs in installations where large numbers of motors are used.

The invention relates to a method and apparatus for assessing performance characteristics of electrical-motor-driven devices. More particularly, it relates to the use of an electric induction motor equivalent circuit for assessing the performance characteristics of induction motor. The equivalent circuit is used as a model for calculating rotor speed, power output, efficiency, and torque of an operating induction motor from a combination of equivalent circuit parameters (i.e., nameplate information) and remotely measured operating variables.

Figure 1:
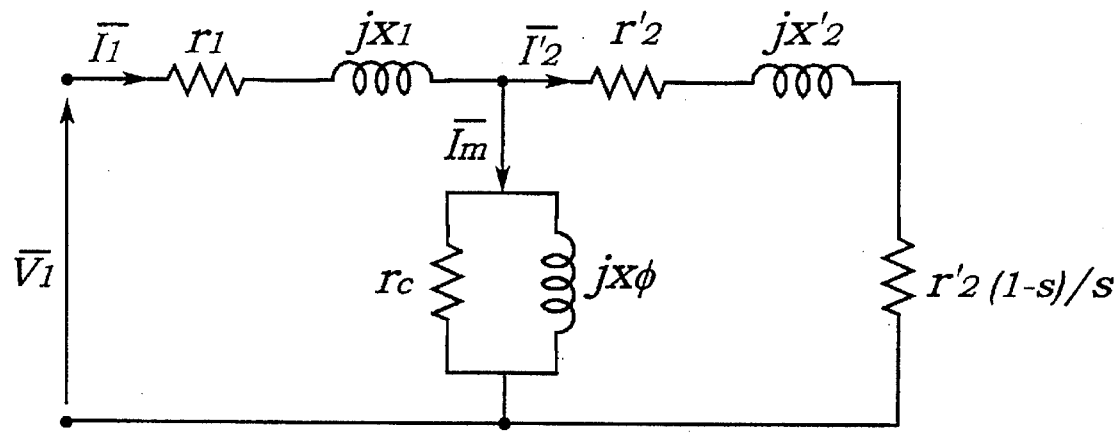
FIGS. 1–4 are various representations of an electrical induction motor equivalent circuit.

Specifically, the equivalent circuit analysis of the subject invention is based on the conventional electric induction motor equivalent circuit as shown in FIGS. 1–4. With reference to FIG. 1, $r_1$=stator resistance, $x_1$=stator leakage inductance, $r'_2$=rotor resistance (stator referred), $x'_2$=rotor leakage inductance (stator referred), $r_c$=core resistance, $x_0$=magnetizing inductance, and s=slip ratio=1−rotor speed/synchronous speed.

Figure 2:
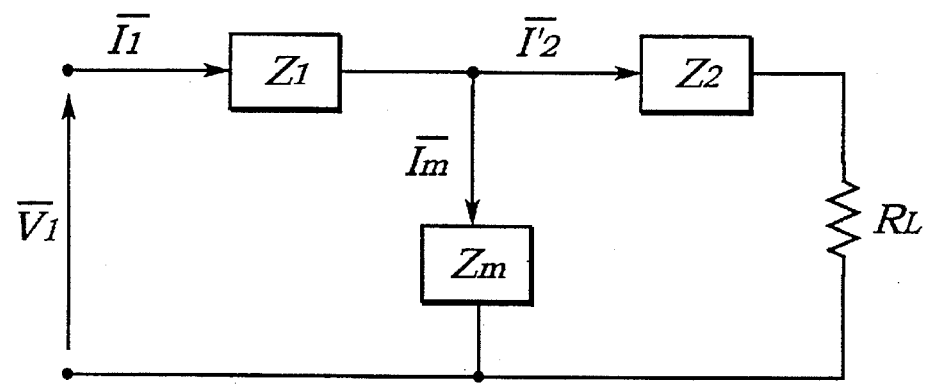

Directing your attention to FIG. 2, the stator impedance, $Z_1$, is given by the relationship, $$Z_1 = r_1 + jx_1;$$

the rotor impedance (stator referred), $Z_2$, is given by the relationship, $$Z_2 = r'_2 + jx'_2;$$

the load resistance (stator referred) is given by the relationship, $$R_L = r'_2(1-s)/s;$$

and the magnetizing impedance, $Z_m$, is given by the relationship, $$Z_m = 1/(1/r_c + 1/(jx_0)).$$

Figure 3:
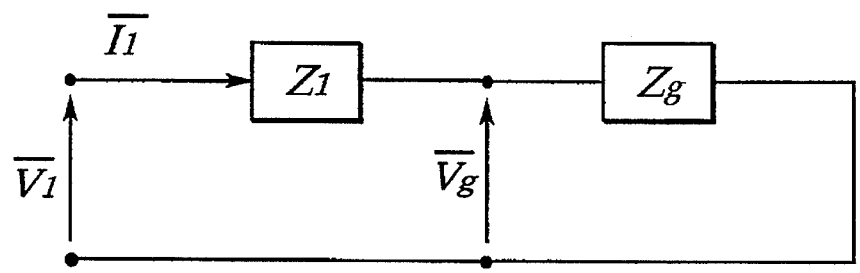

With regard to FIG. 3, the gap impedance, $Z_g$, is calculated based upon the following relationship:

$$Z_g = 1/(1/Z_m + 1/(Z_2 + R_L)).$$

Figure 4:
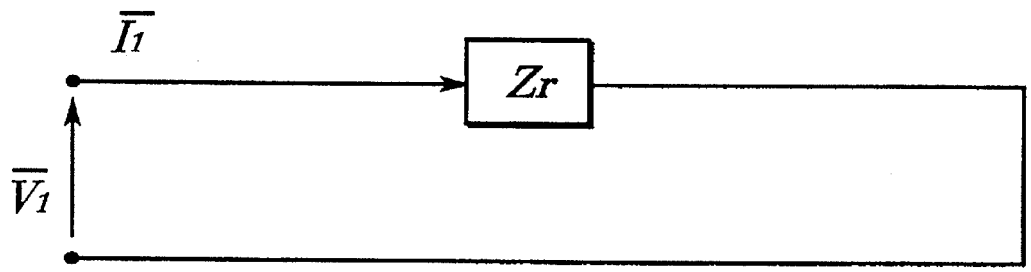

Additionally, as shown in FIG. 4, the total impedance, $Z_T$, can be readily calculated based upon the following relationship:

$$Z_T = Z_1 + Z_g.$$

Figure 5:
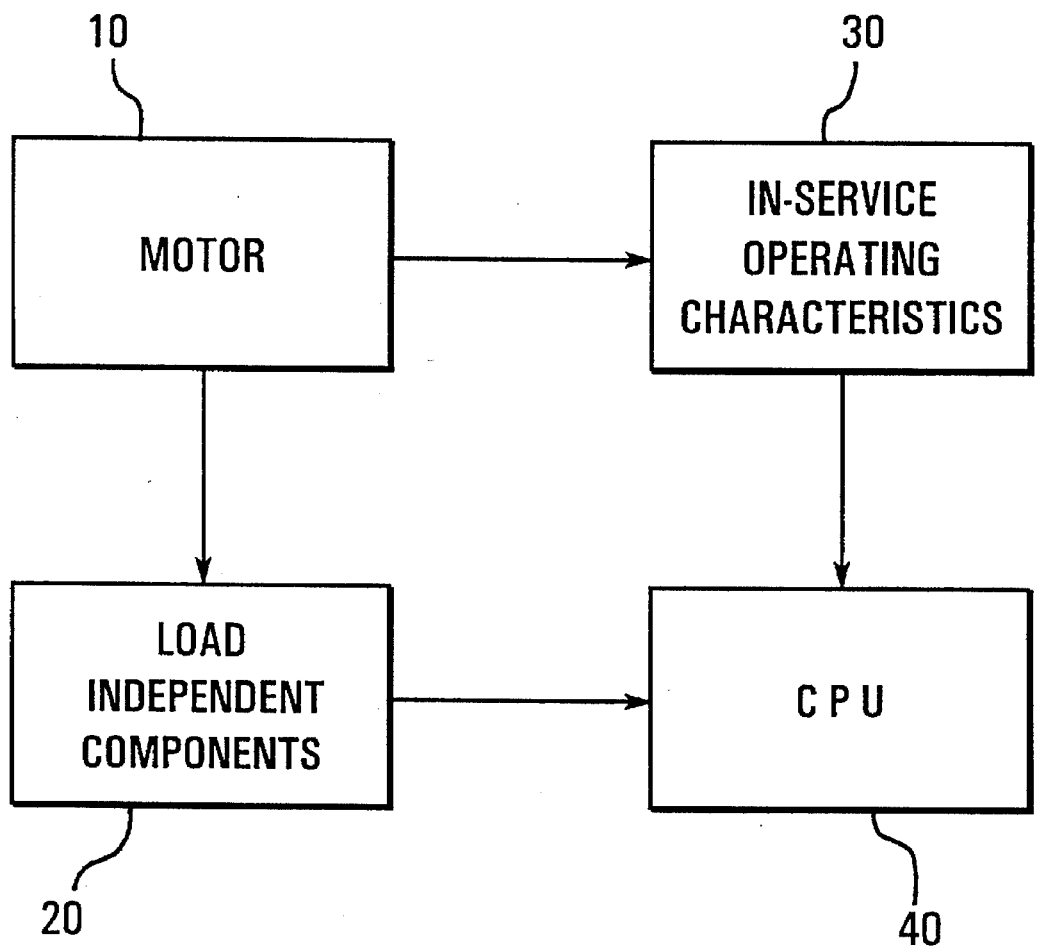
FIG. 5 is a schematic of the subject invention.
Figure 6A:
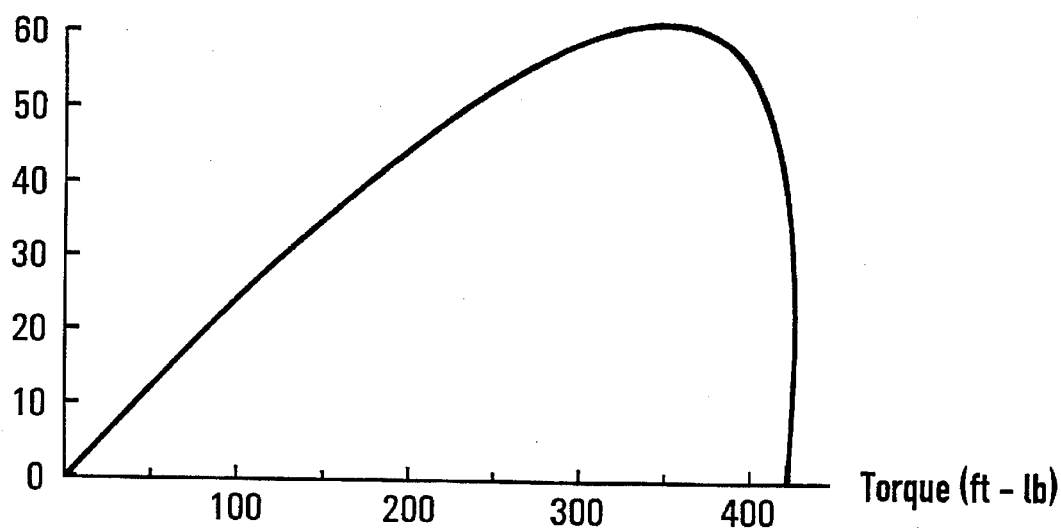
FIGS. 6a and 6b are graphical representations of power output v. torque for an induction motor at 25° C. and 95° C., respectively.
Figure 6B:
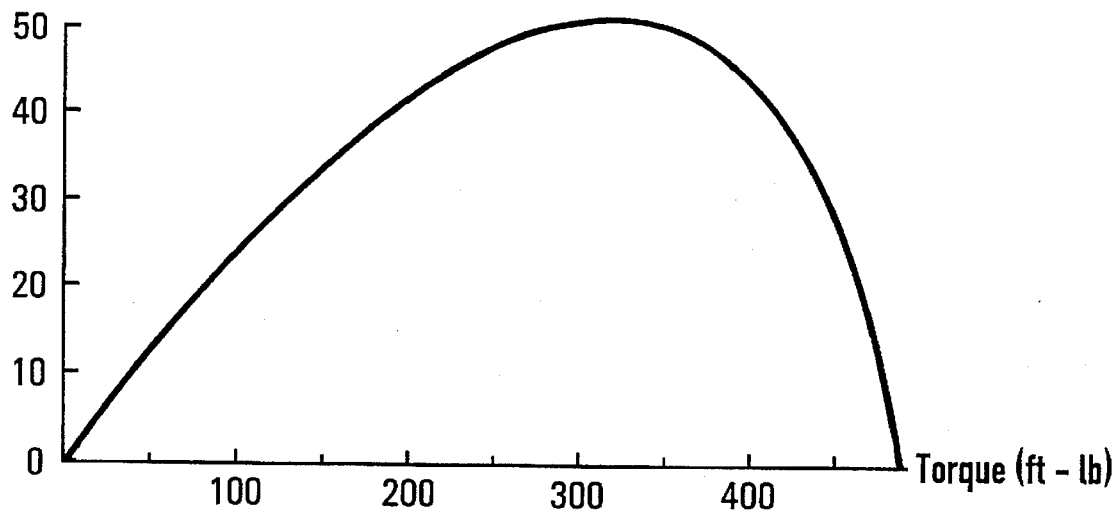
Figure 7A:
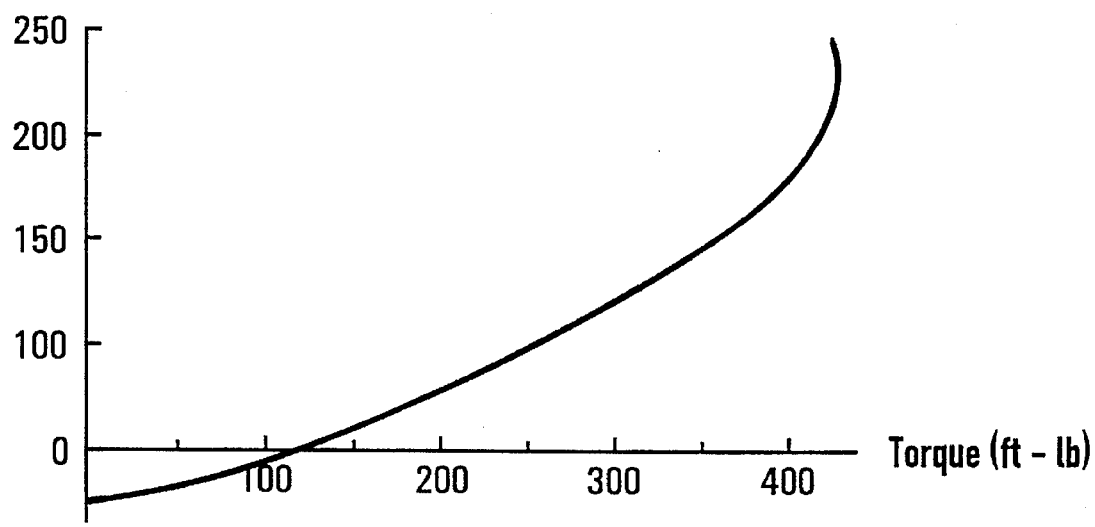
FIGS. 7a and 7b are graphical representations of current v. torque for an induction motor at 25° C. and 95° C., respectively.
Figure 7B:
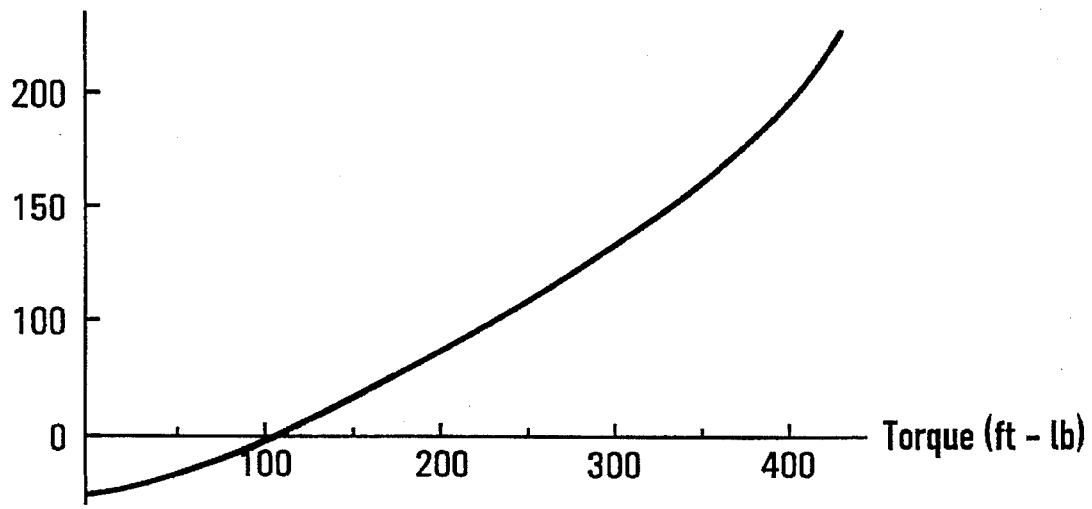
Figure 8A:
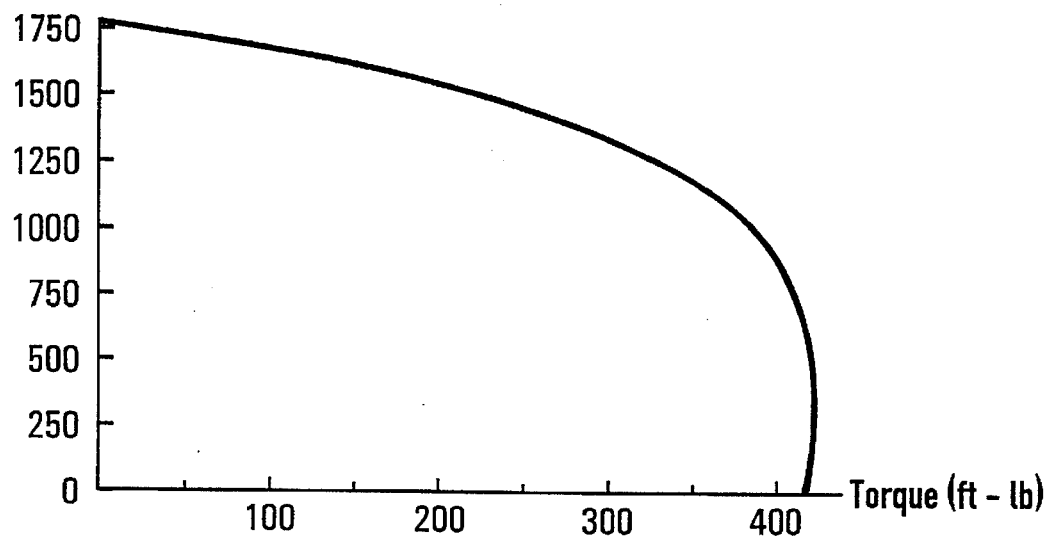
FIGS. 8a and 8b are graphical representations of speed v. torque for an induction motor at 25° C. and 95° C., respectively.
Figure 8B:
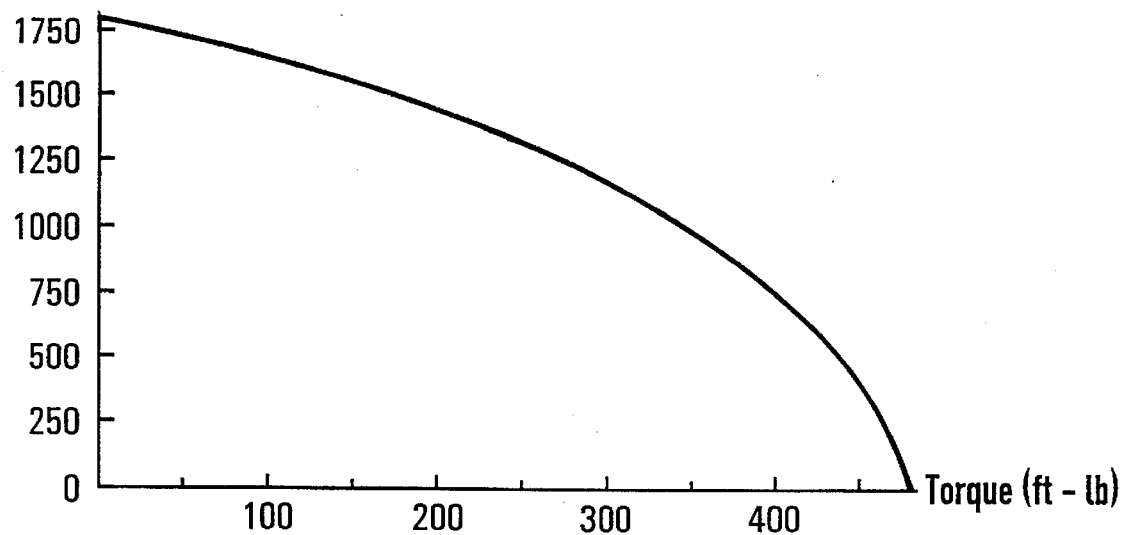

Referring to FIG. 5, the equivalent circuit parameters of the electric induction motor 10, i.e., stator resistance, stator leakage inductance, rotor resistance (stator referred), rotor leakage inductance (stator referred), core resistance, magnetizing inductance, and slip ratio are initially determined 20. The measured equivalent circuit parameters are then applied to the motor equivalent circuit presented above. These values can be readily determined by conventional motor analysis techniques before placing the induction motor and/or apparatus into service. Further, as the motor equivalent circuit reveals, stator impedance, rotor impedance, and magnetizing impedance can be readily calculated from the equivalent circuit parameters.

The waveforms of the motor voltage, $V_1$, and motor current, $I_1$, are then remotely measured while the motor is in service 30. Once again, the motor voltage and the motor current can be remotely measured using conventional motor analysis techniques and/or apparatuses. The motor voltage and motor current are then applied to the motor equivalent circuit, along with the equivalent circuit parameters, and used to compute rotor speed, power output, motor efficiency, and torque of the electric induction motor 40. The root mean square (RMS) values of the voltage and current, and their relative phase difference (power factor), can also be used to calculate rotor speed, power output, motor efficiency, and torque of the electric induction motor. If, however, rotor speed is measured instead of power factor, the same analysis applies since power factor and rotor speed are related as shown below in Equations 2, 5, and 27. Thus, if measurements of both power factor and rotor speed are available, this relationship may be used as a confirmation that the calculation is accurate.

The following mathematical relationships associated with the motor equivalent circuit illustrated in FIGS. 1–4 are utilized to achieve the analysis discussed above. Expressed in standard electrical engineering complex number arithmetic, $$Z_T = V_1/I_1, \quad \text{(Eq. 1)},$$

and $$Z_T = Z_1 + 1/(1/Z_m + 1/(Z_2 + R_L)), \quad \text{(Eq. 2)}.$$

The load resistance, $R_L$, is then given by the relationship $$R_L = 1/(1/(Z_T - Z_1) - 1/Z_m) - Z_2, \quad \text{(Eq. 3)},$$

which can be obtained directly from measurement of $V_1$ and $I_1$ in the following manner:

$$R_L = 1/(1/(V_1/I_1 - Z_1) - 1/Z_m) - Z_2, \quad \text{(Eq. 4)}.$$

As a result of the foregoing relationships, the following four antecedent-consequence relationships can be asserted:

1) Since the load resistance, $R_L$, is related to motor speed by the relationship, $$R_L = r'_2(1-s)/s = r'_2(\text{rotor speed})/(\text{synchronous speed}-\text{rotor speed}), \quad \text{(Eq. 5)},$$

the rotor speed can be determined from the load resistance, $R_L$, because, $$\text{rotor speed} = (1 + r'_2/R_L)/(\text{synchronous speed}), \quad \text{(Eq. 6)}.$$

In its expanded form, rotor speed can be determined directly from $V_1$ and $I_1$ as follows:

$$\text{rotor speed} = (1 + r'_2/(1/(1/(V_1/I_1 - Z_1) - 1/Z_m) - Z_2))/(\text{synchronous speed}), \quad \text{(Eq. 7)}.$$

2) Since the load resistance, $R_L$, is related to the motor power output by the relationship, $$\text{power output} = \text{Abs}[I'_2]^2 R_L, \quad \text{(Eq. 8)},$$

and $$I'_2 = V_g/(Z_2 + R_L) = (I_1(Z_m + Z_1) - V_1)/Z_m, \quad \text{(Eq. 9)},$$

$$V_g = V_1 - I_1 Z_1, \quad \text{(Eq. 10)},$$

$$V_1 = I_1 Z_T, \quad \text{(Eq. 11)},$$

power output can similarly be determined from the load resistance, $R_L$, by the relationship, $$\text{power output} = \text{Abs}[(V_1 - I_1 Z_1)/(Z_2 + R_L)]^2 R_L, \quad \text{(Eq. 12)}.$$

In its expanded form, power output can be determined directly from $V_1$ and $I_1$ as follows:

$$\text{power output} = \text{Abs}[(I_1(Z_1 + Z_m) - V_1)/Z_m]^2 (1/(1/(Z_T - Z_1) - 1/Z_m) - Z_2), \quad \text{(Eq. 13)}.$$

3) Since motor efficiency is given by the relationship, $$\text{motor efficiency} = \text{power input}/\text{power output}, \quad \text{(Eq. 14)},$$

and $$\text{power input} = \text{RealPart}[V_1 I_1], \quad (\text{Eq. 15}),$$

motor efficiency can similarly be determined from $R_L$ based upon the following relationship:

$$\text{motor efficiency} = \text{RealPart}[V_1 I_1]/\text{Abs}[(V_1 - I_1 Z_1)/(Z_2 + R_L)]^2 R_L, \quad (\text{Eq. 16}).$$

In its expanded form, motor efficiency can be determined directly from $V_1$ and $I_1$ as follows:

$$\text{motor efficiency} = \text{RealPart}[V_1 I_1]/\text{Abs}[(I_1(Z+Z_m) - V_1)/ \quad (\text{Eq. 17}).$$
$$Z_m]^2(1/(1/(Z_T - Z_1) - 1/Z_m) - Z_2),$$

4) Since the torque and power output generated by the motor are related by the following relationship:

$$\text{torque} = \text{power output/rotor angular velocity}, \quad (\text{Eq. 18}),$$

and $$\text{rotor angular velocity} = 2\pi \text{ (rotor speed)}, \quad (\text{Eq. 19}),$$

motor torque is given by the following relationship:

$$\text{torque} = \text{Abs}[(I_1(Z_1 + Z_m) - V_1)/Z_m]^2 r'_2/ \quad (\text{Eq. 20}).$$
$$(2\pi(\text{synchronous speed-rotor speed})),$$

In its expanded form torque can be directly calculated from $V_1$ and $I_1$ by the following relationship:

$$\text{torque} = \text{Abs}[(I_1(Z_1 + Z_m) - V_1)/Z_m]^2 r'_2/ \quad (\text{Eq. 21}),$$
$$(2\pi(\text{synchronous speed} - (1 + r'2/(1/(1/(V_1/I_1 - Z_1) - 1/Z_m) - 2))/\text{synchronous speed})),$$

The complex forms of $V_1$ and $I_1$ necessary for the above equations can be determined in any of the following manners:

A) by measuring the RMS values of $V_1$, $I_1$, and the power factor, and applying the following relationships:

$$V_1 = V_{1RMS}, \quad (\text{Eq. 22})$$

$$I_1 = I_{1RMS}(\text{power factor} - j\sqrt{(1-(\text{power factor})^2)}), \quad (\text{Eq. 23});$$

B) by measuring the wave forms of $V_1$ and $I_1$, and utilizing the following relationships in combination with Equation 22 and 23 to calculate $V_1$ and $I_1$:

$$V_{1RMS} = \text{RMS}[\text{wave}V_1], \quad (\text{Eq. 24})$$

$$I_{1RMS} = \text{RMS}[\text{wave}I_1], \quad (\text{Eq. 25})$$

and $$\text{power factor} = \text{Mean}[\text{wave}V_1 \text{wave}I_1]/(V_{1RMS} I_{1RMS}), \quad (\text{Eq. 26})$$

(where $\text{RMS}[x(t)] = \int x(t)^2 dt/\Delta t$, and $\text{Mean}[x(t)] = \int x(t) dt/\Delta t$), C) by measuring the RMS values of $V_1$, $I_1$, and the rotor speed, and computing $R_L$ (Equation 5) and $Z_T$ (Equation 2). Subsequently, the power factor is computed according to the relationship, $$\text{power factor} = \text{RealPart}[Z_T]/\text{Abs}[Z_T] = \text{Cos}[\text{Angle}[\text{PolarForm}[Z_T]]], \quad (\text{Eq. 27})$$

or directly from its expanded form, $$\text{power factor} = \text{Cos}[\text{Angle}[\text{PolarForm}[Z_1 + 1/(1/Z_m + 1/(Z_2 + r'_2/(\text{synchronous speed/rotor speed} - 1)))]]], \quad (\text{Eq. 28}).$$

Once the power factor is determined, $I_{1RMS}$ and $V_{1RMS}$ are used in conjunction with the power factor to calculate $V_1$ and $I_1$.

The minus sign in the imaginary term of Equation 23 presumes that the power factor is lagging, i.e., the waveform of $I_1$ lags in time behind the waveform of $V_1$. If the current is leading, the voltage sign would be positive.

Confirmation of the above calculations is accomplished by measuring both the power factor and the rotor speed, and comparing the measured power factor with calculated power factor. The power factor calculated from the rotor speed (see Equation 28) should match the measured power factor. If the measured and computed power factors match, it may be deduced that the equivalent circuit component values are correct. Thus, confirming that both the motor efficiency and torque are being calculated accurately. If the measured and calculated power factors do not match, then it may be deduced that the equivalent circuit component values used are not representative of the present status of the motor internals and/or that there exists a service condition deficiency, for example, the motor is not being supplied by a clean balanced voltage.

Finding that the equivalent circuit values are nonrepresentative is indicative of motor degradation or a deficiency in the service environment. The ability to determine motor degradation or deficiency is especially noteworthy in mission-critical motors which can be tested prior to being placed in service to accurately determine their equivalent circuit values. Once the motor has been placed in service, its efficient utilization can be monitored on-line. Specifically, in accordance with the subject method, an individual will receive a positive indication that torque and/or motor efficiency are being calculated accurately, or that motor degradation and/or a service condition deficiency has occurred.

The foregoing motor equivalent circuit analysis is preferably conducted on a central processing unit 40, for example, a personal computer, that has been loaded with the appropriate software. In the preferred embodiment, the equivalent circuit parameters are loaded into the system after they have been determined. The remotely monitored variables, i.e., voltage and current, are continuously measured and directly input into the system while the motor is in service.

As stated previously, the electric induction motor equivalent circuit is used to calculate motor conditions such as efficiency, rotor speed, power output and torque. Changes in these conditions due to changes in motor temperature and/or terminal voltage can be readily calculated as demonstrated by the graphical representations of power, current and speed versus torque for motor temperatures of 95° C. and 25° C. (see FIGS. 6a, 7b, 7a, 7b, 8a, and 8b). Negative sequence current effects are assessed by calculating the percent voltage imbalance between phases and then using the curve of NEMA Standard MG 1 Section 14.35 to calculate the resultant horsepower loss. Once the horsepower loss has been determined, the equivalent circuit can be used to calculate the running speed and torque loss associated with the current imbalance.

Using measured values of the driven equipment, e.g. flow, differential pressure, fluid density, etc., the power output of the driven equipment is calculated. Based upon the calculated motor power output, the efficiency of the driven equipment and the overall system are ultimately calculated. Horsepower and rpm ratings of the motor can then be evaluated for optimum system efficiency.

Having described the preferred embodiment of the present invention, it will appear to those of ordinary skill in the art that various modifications may be made to the disclosed embodiment, and that such modifications are intended to be within the scope of the present invention.

What is claimed is:

1. A method for monitoring performance characteristics of an in-service motor, comprising the steps of:
   remotely measuring operating characteristics of said in-service motor;
   applying said operating characteristics to an equivalent circuit for electrical motors;
   evaluating said equivalent circuit by using the resistance of the stator to calculate the power loss from the stator to determine at least one performance characteristic of said in-service motor; and
   confirming the determined at least one performance characteristic of said in-service motor.

2. The method according to claim 1, wherein said motor is an induction motor.

3. The method according to claim 1, wherein said equivalent circuit includes at least one equivalent circuit parameter selected from the group consisting of stator resistance, stator leakage inductance, rotor resistance, rotor leakage inductance, core resistance, magnetizing inductance, and slip ratio.

4. The method according to claim 1, wherein said operating characteristics are current and voltage.

5. The method according to claim 1, wherein one of said performance characteristics is the rotor speed of said in-service motor.

6. The method according to claim 1, wherein one of said performance characteristics is the power output of said in-service motor.

7. The method according to claim 1, wherein one of said performance characteristics is the efficiency of said in-service motor.

8. The method according to claim 1, wherein one of said performance characteristics is the torque of said in-service motor.

9. The method according to claim 1, wherein one of said performance characteristics is the power factor of said in-service motor.

10. An apparatus for monitoring motor performance characteristics of an in-service motor comprising:
    means for remotely measuring operating characteristics of said in-service motor;
    means for applying said operating characteristics to an ac equivalent circuit for electrical motors;
    means for evaluating said ac equivalent circuit by using the resistance of the stator to calculate the power loss from the stator to determine at least one performance characteristic of said in-service motor; and
    means for confirming the determined at least one performance characteristic of said in-service motor.

11. The apparatus according to claim 10, wherein said in-service motor is an induction motor.

12. The apparatus according to claim 11, wherein said operating characteristics are current and voltage.

13. The apparatus according to claim 10, including means for determining at least one equivalent circuit parameter of said in-service motor selected from the group consisting of stator resistance, stator leakage inductance, rotor resistance, rotor leakage inductance, core resistance, magnetizing inductance, and slip ratio; and
    further including means for applying said at least one equivalent circuit parameter to said equivalent circuit.

14. The apparatus according to claim 10, wherein one of said performance characteristics is the slip of said in-service motor.

15. The apparatus according to claim 10, wherein one of said performance characteristics is the power output of said in-service motor.

16. The apparatus according to claim 10, wherein one of said performance characteristics is the efficiency of said in-service motor.

17. The apparatus according to claim 10, wherein one of said performance characteristics is the torque of said in-service motor.

18. The apparatus according to claim 10, wherein one of said performance characteristics is the power factor of said in-service motor.

* * * * *